United States Patent
Kashihara et al.

(10) Patent No.: US 11,355,678 B2
(45) Date of Patent: Jun. 7, 2022

(54) LIGHT-EMITTING DEVICE AND METHOD OF MANUFACTURING THE SAME

(71) Applicant: NICHIA CORPORATION, Anan (JP)

(72) Inventors: Shoichi Kashihara, Komatsushima (JP); Masanobu Sato, Tokushima (JP); Tomohisa Kishimoto, Anan (JP)

(73) Assignee: Nichia Corporation, Anan (JP)

( * ) Notice: Subject to any disclaimer, the term of this patent is extended or adjusted under 35 U.S.C. 154(b) by 116 days.

(21) Appl. No.: 16/262,612

(22) Filed: Jan. 30, 2019

(65) Prior Publication Data

US 2019/0237639 A1 Aug. 1, 2019

(30) Foreign Application Priority Data

Jan. 31, 2018 (JP) .............................. JP2018-014422

(51) Int. Cl.
*H01L 33/00* (2010.01)
*H01L 33/50* (2010.01)
*H01L 33/58* (2010.01)
*H01L 33/08* (2010.01)

(52) U.S. Cl.
CPC ............ *H01L 33/508* (2013.01); *H01L 33/08* (2013.01); *H01L 33/507* (2013.01); *H01L 33/58* (2013.01); *H01L 2933/0058* (2013.01)

(58) Field of Classification Search
CPC ..... H01L 2933/0058; H01L 2933/0091; H01L 33/08; H01L 33/507; H01L 33/508; H01L 33/54; H01L 33/56; H01L 33/58
See application file for complete search history.

(56) References Cited

U.S. PATENT DOCUMENTS

| | | | |
|---|---|---|---|
| 2010/0289048 A1 | 11/2010 | Kumura | |
| 2012/0161621 A1 | 6/2012 | Sato | |
| 2014/0306245 A1 | 10/2014 | Hayashi et al. | |
| 2016/0104827 A1* | 4/2016 | Hong ................ | G02F 1/133603 349/71 |
| 2017/0054110 A1 | 2/2017 | Racz et al. | |
| 2017/0288104 A1 | 10/2017 | Ukawa et al. | |
| 2017/0345982 A1 | 11/2017 | Abe et al. | |
| 2018/0155236 A1* | 6/2018 | DeLamielleure ..... | C03B 17/064 |
| 2019/0348584 A1 | 11/2019 | Abe et al. | |

FOREIGN PATENT DOCUMENTS

| | | | |
|---|---|---|---|
| JP | 2000-269555 A | 9/2000 |
| JP | 2001-77433 A1 | 3/2001 |
| JP | 2002-141557 A | 5/2002 |
| JP | 2003-318848 A | 11/2003 |
| JP | 4167717 B1 | 10/2008 |
| JP | 2012-151466 A | 8/2012 |

(Continued)

*Primary Examiner* — Meiya Li
(74) *Attorney, Agent, or Firm* — Birch, Stewart, Kolasch & Birch, LLP

(57) ABSTRACT

A light-emitting device includes: at least one light-emitting element; a first light-transmissive member covering the light-emitting element; a second light-transmissive member covering the first light-transmissive member; and a light-diffusing member in the second light-transmissive member. The light-diffusing member includes hollow particles. The second light-transmissive member has a bottom surface having irregularities due to presence of the light-diffusing member.

20 Claims, 8 Drawing Sheets

(56) References Cited

FOREIGN PATENT DOCUMENTS

| | | |
|---|---|---|
| JP | 2014-138081 A | 7/2014 |
| JP | 2015-23261 A | 2/2015 |
| JP | 2015-26647 A | 2/2015 |
| JP | 2015-84384 A | 4/2015 |
| JP | 2015-99940 A | 5/2015 |
| JP | 2015-225910 A | 12/2015 |
| JP | 2015-230983 A | 12/2015 |
| JP | 2016-72263 A | 5/2016 |
| JP | 2016-72379 A | 5/2016 |
| JP | 2016-178344 A | 10/2016 |
| JP | 2016-224338 A | 12/2016 |
| JP | 2017-43079 A | 3/2017 |
| JP | 2017-515310 A | 6/2017 |
| JP | 2017-126045 A | 7/2017 |
| JP | 2017-135427 A | 8/2017 |
| JP | 2017-183578 A | 10/2017 |
| JP | 2017-216369 A | 12/2017 |
| JP | 6303738 B2 | 4/2018 |
| JP | 2018-77324 A | 5/2018 |
| JP | 2018-78327 A | 5/2018 |
| WO | WO 2009/066398 A1 | 5/2009 |
| WO | WO 2013/137079 A1 | 9/2013 |
| WO | WO 2016/158808 A1 | 10/2016 |

\* cited by examiner

LIGHT-EMITTING DEVICE AND METHOD OF MANUFACTURING THE SAME

CROSS-REFERENCE TO RELATED APPLICATION

The present application claims priority to Japanese Patent Application No. 2018-014422, filed on Jan. 31, 2018, the contents of which are hereby incorporated by reference in their entirety.

BACKGROUND OF THE INVENTION

1. Field of the Invention

The present disclosure relates to a light-emitting device and a method of manufacturing the same.

2. Description of Related Art

White light-emitting devices employing phosphors such as yellow phosphors and red phosphors are widely used in recent years, and various studies on improvement in the light extraction efficiency, reduction of unevenness in emission color, and the like have been conducted.

In Japanese Patent No. 4167717, which describes one example of such light emitting devices, a surface of a sealing resin has projecting portions to improve light extraction efficiency and luminance.

SUMMARY OF THE INVENTION

However, the color of the phosphor is visible through the light-emitting surface of the light-emitting device in Japanese Patent No. 4167717, and thus an emission color of the light emitting device is different from an object color of the light-emitting surface. In the case in which the light-emitting device mounted in a lighting fixture, when the light-emitting surface is turned off, the object color of the phosphor is conspicuous, which may deteriorate the design.

In view of this, one object of the present disclosure is to uniform the object color of the light-emitting surface.

SUMMARY OF THE INVENTION

A light-emitting device according to one embodiment of the present disclosure includes: at least one light-emitting element; a first light-transmissive member covering the light-emitting element; a second light-transmissive member covering the first light-transmissive member; and a light-diffusing member in the second light-transmissive member. The light-diffusing member comprises hollow particles. The second light-transmissive member has a bottom surface having irregularities due to presence of the light-diffusing member.

A method of manufacturing a light-emitting device according to another embodiment of the present disclosure includes: providing a first in-process product comprising: a base member having a recess, a light-emitting element on or above an inner bottom surface of the base member, and a first light-transmissive member covering the light-emitting element; providing a second light-transmissive member comprising a light-diffusing member comprising hollow particles; allowing the hollow particles to float up to a first surface of the second light-transmissive member to form irregularities due to presence of the light-diffusing member, on the first surface of the second light-transmissive member; hardening the second light-transmissive member; and joining the first light-transmissive member and the second light-transmissive member together via the irregularities.

Another method of manufacturing a light-emitting device according to even another embodiment of the present disclosure includes: providing a second in-process product comprising: a plate-like base member, a light-emitting element on or above the base member, an annular protrusion surrounding the light-emitting element, and a first light-transmissive member covering the light-emitting element; providing a second light-transmissive member comprising at least a light-diffusing member comprising hollow particles; allowing the hollow particles to float up to a first surface of the second light-transmissive member to form irregularities due to presence of the light-diffusing member, on the first surface of the second light-transmissive member; hardening the second light-transmissive member; and joining the first light-transmissive member and the second light-transmissive member together via the irregularities.

Certain embodiments of the present disclosure allows the object color of the light-emitting surface to be uniform.

DETAILED DESCRIPTION OF EMBODIMENTS

Figure 1A:
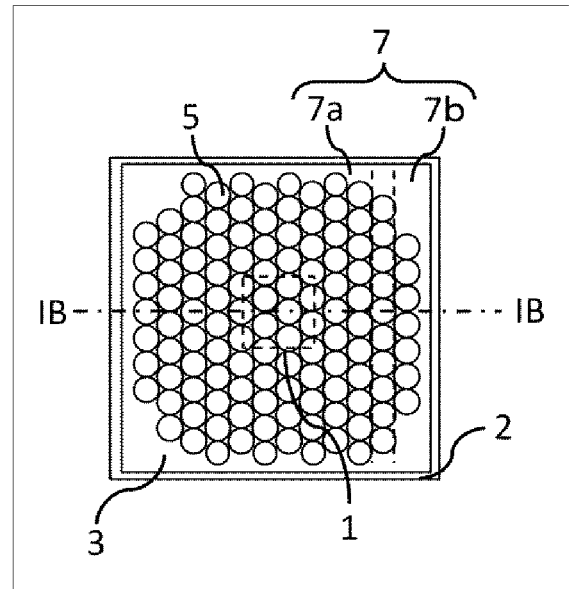
FIG. 1A is a schematic plan view of a light-emitting device according to a first embodiment.

Certain embodiments of the present invention will be described below referring to the accompanying drawings as appropriate. Light-emitting devices described below embody the technical ideas of the present invention, but the scope of the present invention is not intended to be limited thereto. In particular, unless specifically stated otherwise, the sizes, materials, shapes, and relative positions of constituent elements described below are not intended to limit the scope of the present invention thereto but are intended to provide examples for illustration. Sizes or positional relations of members illustrated in the drawings may be exaggerated in order to clarify the descriptions. In the descriptions below, the same term or reference numeral generally represents the same member or members made of the same material, and its detailed description will be omitted as appropriate.

First Embodiment

Figure 1B:
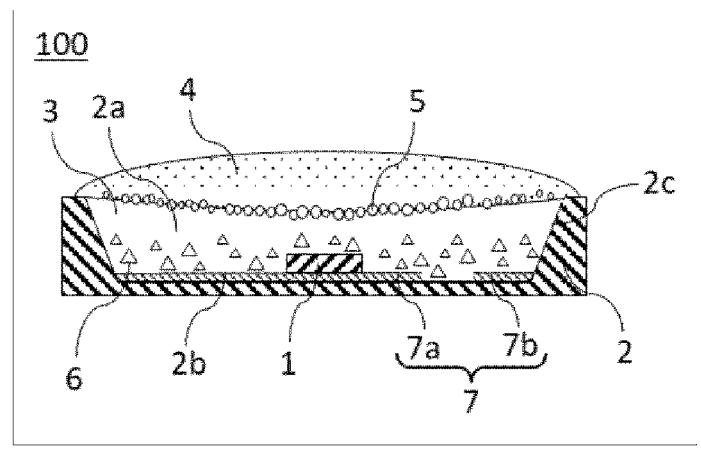
FIG. 1B is a schematic cross-sectional view of the light-emitting device according to the first embodiment taken along the line IB-IB of FIG. 1A.
Figure 1C:
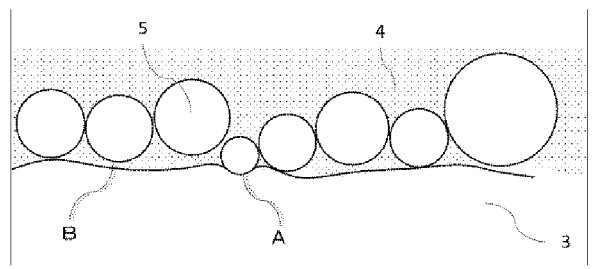
FIG. 1C is a schematic, enlarged, cross-sectional view of the joint surface between a first light-transmissive member and a second light-transmissive member in the light-emitting device according to the first embodiment shown in FIG. 1B.

FIG. 1A is a schematic plan view of a light-emitting device 100 according to the present embodiment. FIG. 1B is a schematic cross-sectional view taken along the line IB-IB of FIG. 1A. FIG. 1C is a schematic, enlarged, cross-sectional view of the joint surface between a first light-transmissive member and a second light-transmissive member shown in FIG. 1B.

The light-emitting device 100 includes a light-emitting element 1, a first light-transmissive member 3 covering the light-emitting element 1, a second light-transmissive member 4 covering the first light-transmissive member 3, and a light-diffusing member 5 in the second light-transmissive member 4. The light-diffusing member 5 contains hollow particles, and the second light-transmissive member 4 has a bottom surface having irregularities due to presence of the light-diffusing member 5. More specifically, the light-emitting device 100 includes a first in-process product 10 and the second light-transmissive member 4. The first in-process product 10 includes a base member 2 having a recess 2a defined by an inner bottom surface 2b and lateral walls 2c, the light-emitting element 1 placed on or above the inner bottom surface 2b of the recess 2a, the first light-transmissive member 3 filled into the recess 2a to cover the light-emitting element 1, and a phosphor 6 contained in the first light-transmissive member 3. The second light-transmissive member 4 covers the first light-transmissive member 3. The second light-transmissive member 4 contains the light-diffusing member 5 and has the bottom surface having irregularities due to presence of the light-diffusing member 5. The first light-transmissive member 3 and the second light-transmissive member 4 are joined together via the irregularities. The density of the phosphor 6 at a light-emitting element 1 side in the first light-transmissive member 3 is higher than the density of the phosphor 6 at a second light-transmissive member 4 side in the first light-transmissive member 3.

First In-Process Product

The first in-process product 10 includes the base member 2 having the recess 2a defined by the inner bottom surface 2b and the lateral walls 2c, wirings 7 disposed on the inner bottom surface 2b of the recess 2a, the light-emitting element 1 disposed on or above the inner bottom surface 2b of the recess 2a and electrically connected to the wirings 7, and the first light-transmissive member 3 filled into the recess 2a to cover the light-emitting element 1.

The lateral walls 2c are preferably inclined such that the recess 2a becomes wider toward the direction of the opening. The angle of inclination of the lateral walls 2c is preferably in the range of 90° to 150°, more preferably 100° to 130°, relative to the inner bottom surface 2b. With the inclination, the phosphor 6 contained in the first light-transmissive member 3 can be hardly observed.

Light-Emitting Element

The light-emitting element 1 is mounted on or above the base member 2 in a face-up manner employing wire bonding using gold wires, silver wires, or aluminum wires, in a flip-chip manner using solder or silver paste, or the like. A single light-emitting element 1 may be mounted on or above the base member 2, or a plurality of light-emitting elements 1 may be mounted on or above the base member 2. Known elements can be used for the light-emitting element 1. For example, a light-emitting diode or a laser diode is preferable. The light-emitting element 1 is electrically connected to the wiring 7 exposed on the inner bottom surface 2b of the recess 2a in the base member 2 and emits light in the wavelength range of ultraviolet to red. For example, for a blue or green light-emitting element 1, GaP or a nitride semiconductor represented by $In_XAl_YGa_{1-X-Y}N$, where $0 \leq X$, $0 \leq Y$, and $X+Y \leq 1$ may be used. For example, for a red light-emitting element 1, GaAlAs, AlInGaP, or the like can be used as well as a nitride semiconductor element. The light-emitting element 1 may have a polygonal shape, such as a square, an elongated rectangle, a triangle, or a hexagon, or a circular or elliptic shape, in a plan view.

Base Member

At least one light-emitting element 1 is mounted on or above the base member 2, and the base member 2 electrically connects the light-emitting device 100 to an external device. The base member 2 has the recess 2a defined by the inner bottom surface 2b and the lateral walls 2c and includes the wiring 6 located on the inner bottom surface 2b of the recess 2a and/or inside the base member 2. The base member 2 has a substantially square outer shape in a plan view. The base member 2 has the recess 2a that has a substantially square shape in a plan view. A material that has high mechanical strength and is less likely to transmit light emitted from the light-emitting element 1 and extraneous light is preferably used for a material of the base member 2. More specifically, the base member 2 may be made of a resin such as polyphthalamide resins (PPA), phenolic resins, bis-maleimide-triazine resins (BT resins), epoxy resins, and silicone resins; a ceramic such as $Al_2O_3$ and AlN; or a metal such as copper, silver, gold, and aluminum. When the base member 2 is made of a metal, the base member 2 may be covered with an insulating material as appropriate.

The base member 2 may include, on a lower surface thereof, a heat dissipation terminal electrically independent of the light-emitting element 1. It is preferable that the heat dissipation terminal have an area larger than the sum of the areas of the upper surfaces of all light-emitting elements 1 included in the light-emitting device 100, and that the heat dissipation terminal overlap the region directly under the light-emitting elements 1. This structure of the heat dissipation terminal allows the light-emitting device 100 to have better heat dissipation performance. The color of the base member 2 may be white, which allows for obtaining good light extraction efficiency, but at least a portion of the upper surface of the package preferably has a dark color such as black, in order to reduce the reflectance of extraneous light, and may have irregularities to scatter extraneous light. The inner walls of the recess 2a may be in a dark color to enhance the display contrast, or the inner walls of the recess 2a may be white to enhance the light extraction efficiency.

Wiring

The wirings 7 includes positive and negative wirings 7a and 7b. The wirings 7 are exposed from the resin on the inner bottom surface 2b of the recess 2a and are arranged such that the upper surface of the wiring 7a is separated from the upper surface of the wiring 7b. The wirings 7 are formed by, for example, electroplating. The thickness of the wirings 7 may be uniform, or may be partially increased or reduced. The wiring 7 is preferably made of a material that has a high thermal conductivity and high mechanical strength and is easy to process by punching or etching. Examples of a material for the wiring 7 include metals such as copper, aluminum, gold, silver, tungsten, iron, and nickel and alloys such as iron-nickel alloys and phosphor bronze. The wirings 7 can alternatively be formed by using electroless plating, vacuum evaporation, sputtering, or other methods.

First Light-Transmissive Member

The first light-transmissive member 3 is disposed in the recess 2a and covers the light-emitting element 1. The first light-transmissive member 3 contains the phosphor 6, and the density of the phosphor 6 at the light-emitting element 1 side in the first light-transmissive member 3 is higher than the density of the phosphor 6 at the second light-transmissive member 4 side in the first light-transmissive member 3.

The first light-transmissive member 3 is preferably made of a material with a high light-transmittance, such as thermosetting resins and thermoplastic resins. Examples of thermosetting resins include silicone resins, modified silicone resins, silicone hybrid resins, epoxy resins, modified epoxy resins, urea resins, diallyl phthalate resins, phenolic resins, unsaturated polyester resins, and hybrid resins each containing one or more of these resins. In particular, silicone resins and modified or hybrid resins thereof have good resistance to heat and light, and therefore these resins are preferable. The first light-transmissive member 3 has a transmittance of 50% or more, preferably 70% or more, more preferably 85% or more.

Second Light-Transmissive Member

The second light-transmissive member 4 covers the first light-transmissive member 3. The second light-transmissive member 4 contains the light-diffusing member 5 and has a bottom surface having irregularities due to presence of the light-diffusing member 5. The first light-transmissive member 3 and the second light-transmissive member 4 are joined together via the irregularities, and the light-diffusing member 5 is located above the phosphor 6 contained in the first light-transmissive member 3. With this arrangement, extraneous light such as sunlight or illumination light is reflected and dispersed by the light-diffusing member 5 disposed on the bottom surface of the second light-transmissive member 4, and thus is less likely to reach the phosphor 6 present at the light-emitting element 1 in the first light-transmissive member 3, so that it becomes difficult to see the object color or the object reflection color of the phosphor 6. In other words, the object color of the light-emitting surface becomes white. The "bottom surface of the second light-transmissive member 4" refers to the joint surface between the first light-transmissive member 3 and the second light-transmissive member 4, and the "bottom surface the second light-transmissive member 4" basically refers to a surface of the second light-transmissive member 4 in contact with the first light-transmissive member 3.

As shown in FIG. 1C, the bottom surface of the second light-transmissive member 4 includes protruding portions A, in which the light-diffusing member 5 protrudes from the second light-transmissive member 4 and is covered with the first light-transmissive member 3, and covered portions B, in which the second light-transmissive member 4 covers the light-diffusing member 5. The second light-transmissive member 4 does not necessarily cover the entirety of the light-diffusing member 5. The light-diffusing member 5 is located at a bottom surface and/or near the bottom surface of the second light-transmissive member 4 such that the bottom surface of the second light-transmissive member 4 has irregularities. The light-diffusing member 5 is covered with the first light-transmissive member 3 or the second light-transmissive member 4. With this structure, fine particles are not easily fallen off or damaged in the light-emitting device 100 according to the present embodiment due to impact or other causes than in a conventional light-emitting device in which fine particles are adhered to the surface of silicone resin that has already been cured.

The bottom surface of the second light-transmissive member 4 has height differences of 2 μm to 5 μm due to the irregularities due to presence of the light-diffusing member 5. The adhesion strength between silicone resins with different compositions is weak, and the interface between the resins is fragile. However, the irregularities due to presence of the light-diffusing member 5 exhibit anchoring effect, which allows for enhancing the adhesion.

The second light-transmissive member 4 is preferably made of a material with a high light-transmittance, such as thermosetting resins and thermoplastic resins. Examples of thermosetting resins include silicone resins, modified silicone resins, silicone hybrid resins, epoxy resins, modified epoxy resins, urea resins, diallyl phthalate resins, phenolic resins, unsaturated polyester resins, and hybrid resins each containing one or more of these resins. In particular, silicone resins and modified or hybrid resins thereof have a high resistance to heat and light, and therefore these resins are preferable. The second light-transmissive member 4 has a transmittance of 50% or more, preferably 70% or more, more preferably 85% or more. A surface of the first light-transmissive member 3 to be joined to the second light-transmissive member 4 may be plasma-treated in order to improve the adhesion before the second light-transmissive member 4 is joined thereto.

The second light-transmissive member 4 may have a lenticular shape. With the lenticular shape, light is concentrated, and therefore a portion of light that is otherwise reflected by the lateral walls 2c can be extracted, so that unevenness in emission color according to the angle of the light-emitting device can be reduced. With this structure, where a direction in which the front surface of the light-emitting portion faces is referred to as a 0° direction, a direction in which a lateral surface of the light-emitting device faces is referred to as a −90° direction, and the direction in which its opposite lateral surface faces is referred to as a 90° direction, a uniform color of light emitted from the light-emitting device can be expected in the range of the −90° direction to the 90° direction.

Light-Diffusing Member

The light-diffusing member 5 contains hollow fine particles. As shown in FIG. 1A, it is preferable that the light-diffusing member 5 is uniformly disposed on the bottom surface of the second light-transmissive member 4. The distances among the particles and the degrees of exposure of the particles on the bottom surface of the second light-transmissive member 4 may be varied according to the size, shape, and other conditions of the hollow particles. The light-diffusing member 5 is disposed such that at least a part of the light-diffusing member 5 is exposed from the second light-transmissive member 4 and such that a portion of the light-diffusing member 5 exposed from the second light-transmissive member 4 is covered with the first light-transmissive member 3. The hollow particles may have any appropriate particle size, but the particle size is preferably in the range of 5 µm to 100 µm, more preferably 20 µm to 70 µm, particularly preferably 45 µm to 65 µm. The particle size herein is expressed as the median diameter. The smaller the particle size and volume of the hollow particles are, the weaker the buoyancy becomes, and therefore the hollow particles are less likely to float up in the second light-transmissive member 4. The hollow particles preferably have a shell thickness in the range of 1 µm to 30 µm, more preferably 5 µm to 20 µm. The larger the porosity of the hollow particles, the more easily the hollow particles can be float up, but the smaller the shell thickness of the hollow particles, which may easily cause damage to the fine particles. Accordingly, with the particle size and the shell thickness in the ranges as described above, the hollow particles can be easily floated up to the bottom surface of the second light-transmissive member 4 and the fine particles can be hardly damaged. Thus, preferable irregularities can be formed on the bottom surface of the second light-transmissive member 4, which can facilitate scattering of light on the bottom surface of the second light-transmissive member 4 and preventing glare.

The bulk density or specific gravity of the light-diffusing member 5 relative to the second light-transmissive member 4 is preferably in the range of 0.1 g/cm$^3$ to 0.7 g/cm$^3$. The bulk density relative to the second light-transmissive member 4 is more preferably in the range of 0.1 g/cm$^3$ to 0.2 g/cm$^3$. The smaller the bulk density relative to the second light-transmissive member 4 is, the more easily the light-diffusing member 5 floats up. With a too small bulk density of the light-diffusing member 5, troubles such as floating up of the light-diffusing member 5 during dispersing into the second light-transmissive member 4 and uneven distribution in a dispenser may occur, resulting in impairment of the workability. With the bulk density of the light-diffusing member 5 in the range described above, the light-diffusing member 5 floats up to a surface that will become the bottom surface of the second light-transmissive member 4 after the light-diffusing member 5 is dispersed into the second light-transmissive member 4. Irregularities are thus easily formed on a surface that will become the bottom surface of the second light-transmissive member 4.

The light-diffusing member 5 preferably has a spherical shape. With the light-diffusing member 5 having a spherical shape, a plurality of irregularities are likely to be uniformly formed on the bottom surface of the second light-transmissive member 4. The light-diffusing member 5 may be white hollow fine particles or transparent hollow fine particles that look white by scattering caused due to difference in refractive index from the surrounding material. The light-diffusing member 5 scatters light emitted from the light-emitting element 1, which allows for improving the light extraction efficiency of the light-emitting device 100. Accordingly, the light-diffusing member 5 is preferably made of a material that greatly differs in refractive index from the second light-transmissive member 4. Examples of the material for the light-diffusing member 5 include micro powders such as hollow silica, hollow glass, hollow ceramic, fly ash, Shirasu balloons, hollow polymer, porous silica, and porous polymer. The light-diffusing member 5 may be a micro powder containing two or more of the above materials. For example, the light extraction efficiency of the light-emitting element 1 to the outside can be enhanced by using a silicone resin having a refractive index of 1.50 to 1.55 for the second light-transmissive member 4 and using hollow silica having a refractive index of 1.35 to 1.45 for the light-diffusing member 5.

The addition amount of the light-diffusing member 5 to the second light-transmissive member 4 is preferably in the range of 1.56 vol % to 19.3 vol %, more preferably 7.3 vol % to 10.6 vol %. The larger the amount of addition of the light-diffusing member 5 is, the whiter the external appearance viewed from the light-emitting surface becomes. If the amount of addition of the light-diffusing member 5 is too large, transmittance may be decreased, which may reduce luminous intensity of the light-emitting device. If the amount of addition is too small, the object color viewed from the bottom surface of the second light-transmissive member 4 becomes the object color of the phosphor 6. With the amount of addition of the light-diffusing member 5 to the second light-transmissive member 4 in the range as described above, the external appearance viewed from the light-emitting surface can be made white without reducing the luminous intensity of the light-emitting device. The unit "vol %" of the addition amount of the light-diffusing member 5 indicates the volume of addition amount of the light-diffusing member 5 with respect to the volume of the second light-transmissive member 4 containing the light-diffusing member 5, and other light-diffusing members. For example, the expression "the addition amount of the light-diffusing member 5 is 10 vol %" refers to that the volume of the light-diffusing member 5 relative to the total volume of 100 cm$^3$ including the volumes of the second light-transmissive member, the light-diffusing member 5, and other additives, is 10 cm$^3$.

Phosphor

The phosphor 6 is adapted to absorb light emitted from the light-emitting element 1 and convert the light emitted from the light-emitting element 1 into light with a different wavelength. Examples of the phosphor 6 include cerium-activated yttrium-aluminum-garnet (YAG)-based phosphors; cerium-activated lutetium-aluminum-garnet (LAG)-based phosphors; europium- and/or chromium-activated nitrogen-containing calcium aluminosilicate ($CaO$—$Al_2O_3$—$SiO_2$)-based phosphors; europium-activated silicate (($Sr,Ba)_2SiO_4$)-based phosphors; nitride-based phosphors such as β-SiAlON phosphors, $CaAlSiN_3$:Eu (CASN)-based phosphors, and $(Sr,Ca)AlSiN_3$:Eu (SCASN) phosphors; $K_2SiF_6$:Mn (KSF) phosphors; and sulfide-based phosphors. With such a phosphor, a light-emitting device that emits mixed light (such as white light) of primary light and secondary light, each having a wavelength of visible light, or a light-emitting device that emits visible secondary light through excitation by ultraviolet primary light can be provided. A plurality of types of phosphors 5 may be used in combination. Color rendering properties and color reproducibility can be adjusted by employing a combination or mixing ratio suitable to a desired color tone. The density of the phosphor 6 at the light-emitting element 1 side in the first light-transmissive member 3 is preferably higher than the density of the phosphor 6 at a bottom surface side of the first light-transmissive member 3 in the first light-transmissive member 3. Increasing the density of the phosphor 6 at the light-emitting element 1 side allows for increasing the wavelength conversion ratio and reducing the addition amount of the phosphor 6 required to achieve a desired chromaticity.

In the light-emitting device 100 according to the present embodiment, the particle size, bulk density, amount of addition, and the like of the light-diffusing member 5, which is added to the second light-transmissive member 4 originally in order to control the light distribution, are adjusted appropriately to form irregularities on the bottom surface of the second light-transmissive member 4. Thus, with the irregularities formed on the bottom surface of the second light-transmissive member 4, extraneous light can be effectively scattered, and thus a light-emitting device 100 with white external appearance when viewed from the light-emitting surface can be provided. In the case where a plurality of light-emitting elements 1 are included, the light-emitting elements are spaced apart from each other at a predetermined distance, and the light-diffusing member 5 covers all the light-emitting elements 1 mounted in the light-emitting device 100 in a plan view. With this structure, the light-diffusing member 5 scatters light emitted from the light-emitting elements 1 to reduce the difference in brightness in the ON state between the light-emitting portion including the light-emitting element 1 and the non-light-emitting portion including no light-emitting element, so that the light-emitting device 100 with reduced unevenness in luminance when mounted on a lighting fixture can be provided.

Method of Manufacturing According to First Embodiment

Subsequently, a method of manufacturing the light-emitting device according to the first embodiment is described referring to FIG. 2 and FIGS. 3A to 3F. The order of some steps is not limited to the description below, but may be changed.

Figure 2:
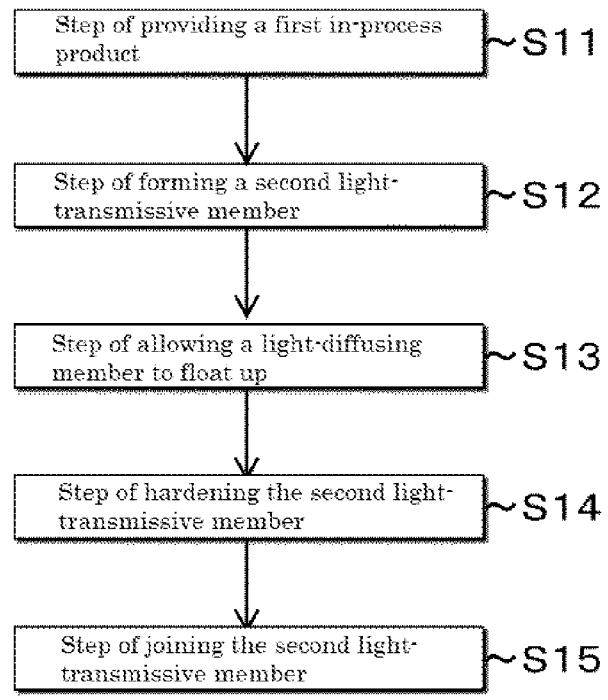
FIG. 2 is a flowchart illustrating a method of manufacturing the light-emitting device according to the first embodiment.

FIG. 2 is a flowchart illustrating the method of manufacturing the light-emitting device according to the first embodiment. The method of manufacturing the light-emitting device according to the first embodiment includes Step S11 of providing a first in-process product, Step S12 of forming a second light-transmissive member, Step S13 of allowing a light-diffusing member to float up, Step S14 of hardening the second light-transmissive member, and Step S15 of joining the second light-transmissive member.

Figure 3A:
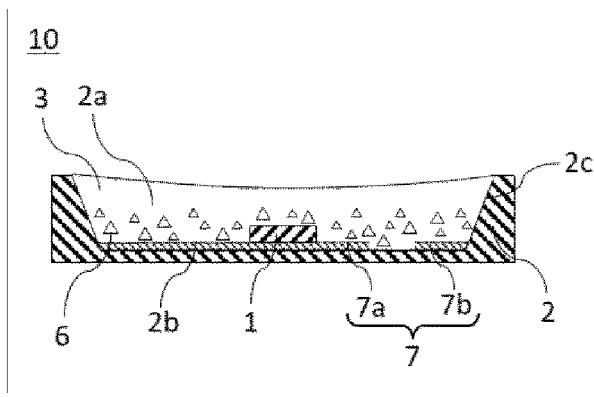
FIG. 3A is a schematic cross-sectional view for illustrating a step of providing a first in-process product in the method of manufacturing the light-emitting device according to the first embodiment.
Figure 3B:
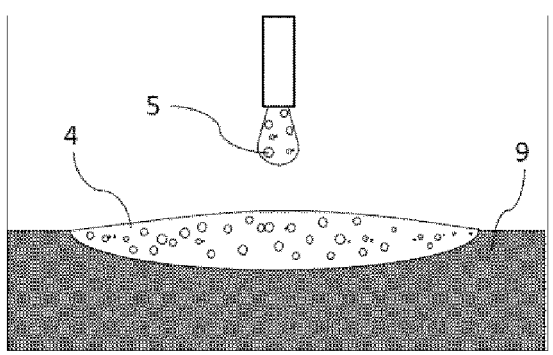
FIG. 3B is a schematic cross-sectional view for illustrating a step of forming a second light-transmissive member in the method of manufacturing the light-emitting device according to the first embodiment.
Figure 3C:
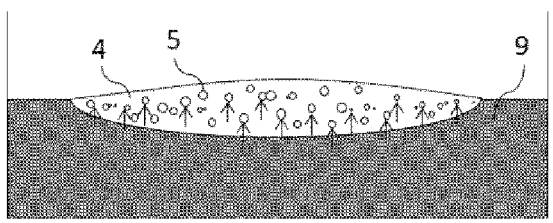
FIG. 3C is a schematic cross-sectional view for illustrating a step of allowing a light-diffusing member to float up in the method of manufacturing the light-emitting device according to the first embodiment.
Figure 3D:
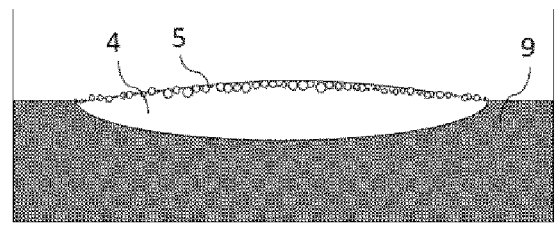
FIG. 3D is a schematic cross-sectional view for illustrating a step of hardening the second light-transmissive member in the method of manufacturing the light-emitting device according to the first embodiment.
Figure 3E:
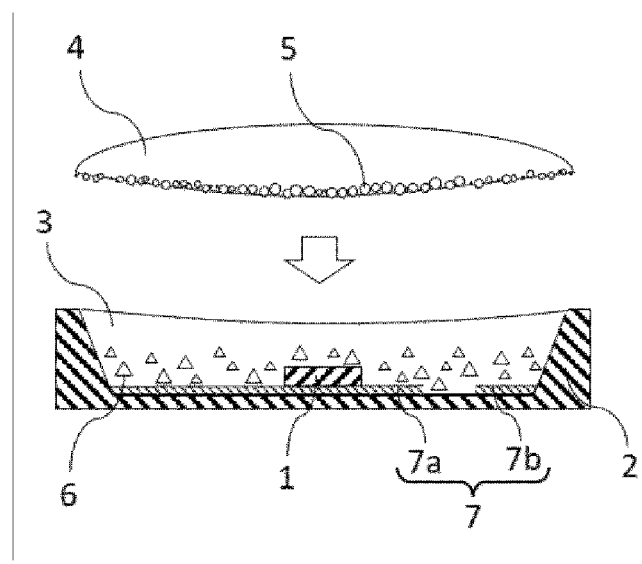
FIG. 3E is a schematic cross-sectional view for illustrating a step of joining the second light-transmissive member in the method of manufacturing the light-emitting device according to the first embodiment.
Figure 3F:
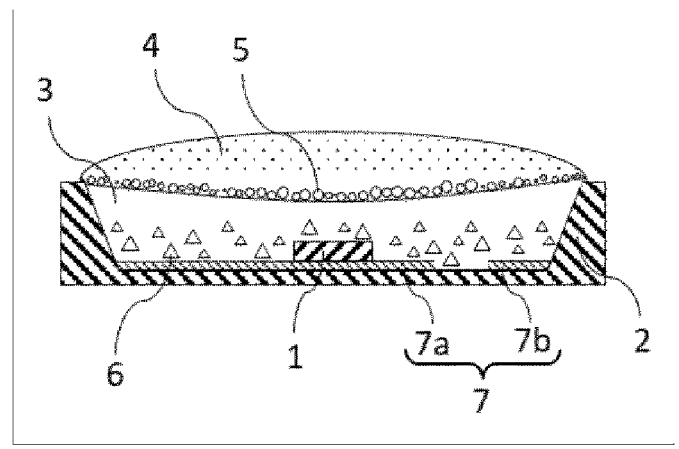
FIG. 3F is a schematic cross-sectional view for illustrating the step of joining the second light-transmissive member in the method of manufacturing the light-emitting device according to the first embodiment.

FIG. 3A is a schematic cross-sectional view for illustrating the step of providing a first in-process product in the method of manufacturing the light-emitting device according to the first embodiment. FIG. 3B is a schematic cross-sectional view for illustrating the step of forming a second light-transmissive member in the method of manufacturing the light-emitting device according to the first embodiment. FIG. 3C is a schematic cross-sectional view for illustrating the step of allowing a light-diffusing member to float up in the method of manufacturing the light-emitting device according to the first embodiment. FIG. 3D is a schematic cross-sectional view for illustrating the step of hardening the second light-transmissive member in the method of manufacturing the light-emitting device according to the first embodiment. FIG. 3E and FIG. 3F are schematic cross-sectional views for illustrating the step of joining the second light-transmissive member in the method of manufacturing the light-emitting device according to the first embodiment.

Providing First In-Process Product

The first in-process product 10 is provided in which the light-emitting element 1 is disposed on or above the inner bottom surface 2b of the base member 2 defining the recess 2a and covered with the first light-transmissive member 3.

As shown in FIG. 3A, in Step S11 of providing a first in-process product, the first in-process product 10 in which the light-emitting element 1 is disposed on or above the inner bottom surface 2b of the recess 2a of the base member 2, which has the recess 2a defined by the inner bottom surface 2b and the lateral walls 2c and is covered with the first light-transmissive member 3, is provided. In Step S11 of providing a first in-process product, the light-emitting element 1 is electrically connected to the wirings 7 on the base member 2 by wires or bumps. Hereinafter, a case in which a silicone resin is used for a material of the first light-transmissive member 3 will be illustrated. In the first light-transmissive member 3, the phosphor 6 has been added to a silicone resin, and the phosphor 6 is uniformly dispersed in the silicone resin. The silicone resin is dropped into the recess 2a of the base member 2 by, for example, using a potting technique with the use of a dispenser.

Forming Second Light-Transmissive Member

The second light-transmissive member 4 containing at least the light-diffusing member 5 including the hollow particles is provided. Hereinafter, a case in which a silicone resin is used for a material of the second light-transmissive member 4 will be illustrated.

As shown in FIG. 3B, Step S12 of forming a second light-transmissive member is a step of injecting and filling a silicone resin that constitutes the second light-transmissive member 4 into a mold 9. In Step S12 of forming a second light-transmissive member, the light-diffusing member 5 has been added to a silicone resin, and the light-diffusing member 5 is uniformly dispersed in the silicone resin. The silicone resin is dropped into the mold 9 by, for example, using a potting technique with the use of a dispenser. Alternatively, the second light-transmissive member 4 may be formed by forming an annular frame on a release film and then injecting and filling the silicone resin into the inside of the frame.

As shown in FIG. 3B, in Step S12 of forming a second light-transmissive member, the silicone resin containing the light-diffusing member 5 is filled into the mold 9. With the use of the light-diffusing member 5 with a predetermined particle size, bulk density, and amount of addition, in subsequent Step S13, which is the subsequent step, after the light-diffusing member 5 is uniformly dispersed in the silicone resin, the light-diffusing member 5 can float up to a first surface or the vicinity of the first surface of the silicone resin, which will become the bottom surface of the second light-transmissive member 4.

A surface of the second light-transmissive member 4 may be formed into a lenticular shape.

Allowing Light-Diffusing Member to Float Up

The hollow particles are allowed to float up to a first surface of the second light-transmissive member 4, which will become the bottom surface of the second light-transmissive member 4, so that the irregularities attributable to the light-diffusing member 5 are formed on the surface of the second light-transmissive member 4.

As shown in FIG. 3C, in Step S13 of allowing a light-diffusing member to float up, the light-diffusing member 5 is allowed to float up to the first surface of the silicone resin. In Step S13 of allowing a light-diffusing member to float up, the silicone resin in which the light-diffusing member 5 is uniformly dispersed is left at 40° C. for 12 hours. The light-diffusing member 5 is lighter than the silicone resin, and the adjustment of the particle size and the like has been performed as described above. Therefore, the light-diffusing member 5 gradually floats up in the unhardened silicone resin (see the arrows in FIG. 3C) with time, so that the light-diffusing member 5 is floated up to the first surface and/or to the vicinity of the first surface of the silicone resin. Irregularities according to the shape of the light-diffusing member 5 are thus formed on the first surface of the silicone resin.

The floating up of the hollow particles may be performed by leaving the second light-transmissive member 4 containing the hollow particles for a predetermined time or by applying vibration such as ultrasonic waves. Applying ultrasonic waves to the second light-transmissive member 4 allows the hollow particles to float up quickly and uniformly; however, the convex shape of the second light-transmissive member 4 may be slightly flattened.

Hardening Second Light-Transmissive Member

The second light-transmissive member 4 is hardened.

As shown in FIG. 3D, in Step S14 of hardening the second light-transmissive member, the silicone resin is hardened. In Step S14 of hardening the second light-transmissive member, the silicone resin is heated at 150° C. for 4 hours. Hardening the silicone resin by heat allows the light-diffusing member 5, which has floated up to the first surface and/or the vicinity of the first surface of the silicone resin, to be fixed in the vicinity of the surface of the silicone resin, so that irregularities are formed on the first surface of the silicone resin. The temperature for the heating is preferably adjusted to a temperature around 150° C. in order to form the irregularities for improving the adhesion to the first light-transmissive member 3 on the first surface of the silicone resin in Step S15, which is the subsequent step.

Joining Second Light-Transmissive Member

The first light-transmissive member 3 and the second light-transmissive member 4 are joined together via the irregularities.

As shown in FIG. 3E and FIG. 3F, in Step S15 of joining the second light-transmissive member, the second light-transmissive member 4 is joined to the first light-transmissive member 3 to cover the first light-transmissive member 3. The irregularities due to presence of the light-diffusing member 5 are formed on the joint surface between the first light-transmissive member 3 and the second light-transmissive member 4.

The light-emitting device 100 is manufactured through the steps as described above. The steps described above have been illustrated referring to one light-emitting device 100, but a plurality of light-emitting devices 100 connected to each other through the base members 2 may be formed at once and then separated to provide individual light-emitting devices 100.

In the method of manufacturing the light-emitting device according to the first embodiment, the particle size, bulk density, amount of addition, and the like are adjusted as appropriate to float up the light-diffusing member 5 to the bottom surface and/or the vicinity of the bottom surface of the second light-transmissive member 4, so that the irregularities due to presence of the light-diffusing member 5 are formed on the bottom surface of the second light-transmissive member 4. Thus, the light-emitting device 100 having a white external appearance viewed from the light-emitting surface can be provided. Further, the light-diffusing member 5 is embedded in the first light-transmissive member 3 or the second light-transmissive member 4, so that a light-emitting device in which the light-diffusing member 5 can be prevented from being damaged by impact or the like.

Second Embodiment

Figure 4A:
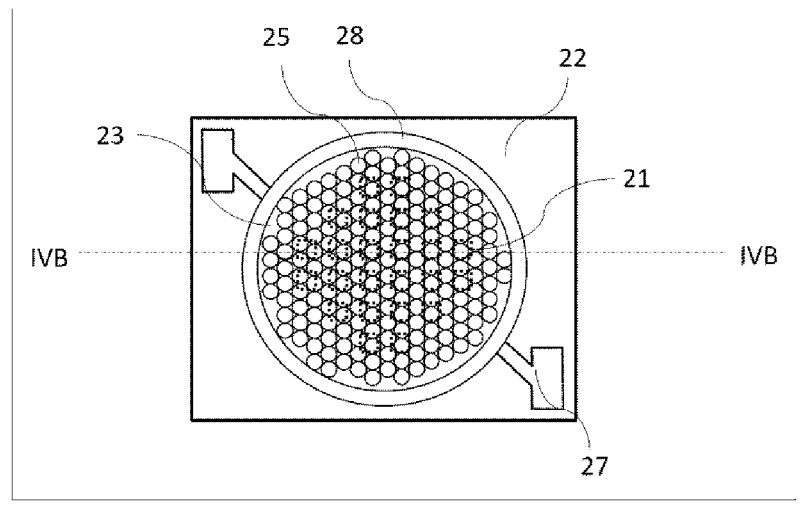
FIG. 4A is a schematic plan view of a light-emitting device according to a second embodiment.
Figure 4B:
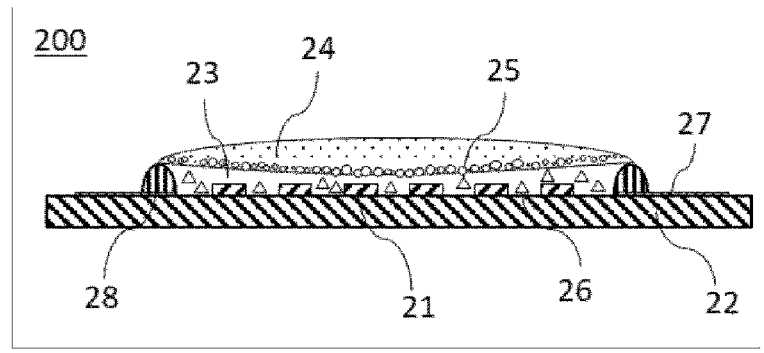
FIG. 4B is a schematic cross-sectional view of the light-emitting device according to the second embodiment taken along the line IVB-IVB of FIG. 4A.
Figure 4C:
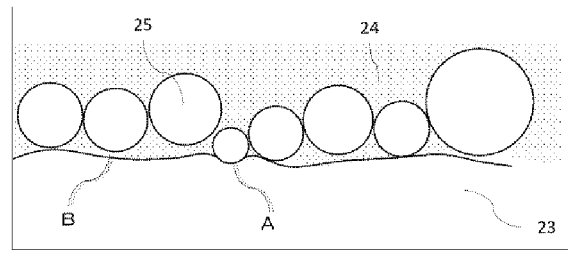
FIG. 4C is a schematic, enlarged, cross-sectional view of the joint surface between a first light-transmissive member and a second light-transmissive member in the light-emitting device according to the second embodiment shown in FIG. 4B.

FIG. 4A is a schematic plan view of a light-emitting device 200 according to a second embodiment. FIG. 4B is a schematic cross-sectional view taken along the line IVB-IVB of FIG. 4A. FIG. 4C is a schematic, enlarged, cross-sectional view of the joint surface between a first light-transmissive member and a second light-transmissive member shown in FIG. 4B.

The light-emitting device 200 includes a second in-process product 20 that includes a plate-like base member 22, one or more light-emitting elements 21 on or above the base member 22, a protrusion 28 annularly surrounding the light-emitting elements 21, a first light-transmissive member 23 covering the light-emitting elements 21, and a phosphor 26 contained in the first light-transmissive member 23; a second light-transmissive member 24 covering the first light-transmissive member 23; and a light-diffusing member 25 contained in the second light-transmissive member 24. The light-diffusing member 25 includes hollow particles, irregularities due to presence of the light-diffusing member 25 are formed on the bottom surface of the second light-transmissive member 24, and the irregularities are covered with the first light-transmissive member 23. The density of the phosphor 26 at the light-emitting elements 21 side in the first light-transmissive member 23 is higher than the density of the phosphor 26 at the first surface side of the first light-transmissive member 23 in the first light-transmissive member 23.

Constitutions of the light emitting device 200 will be described below. The light-emitting elements 21, the first light-transmissive member 23, the second light-transmissive member 24, the light-diffusing member 25, the phosphor 26, and wiring 27 are substantially the same as in the first embodiment, and their detailed descriptions are therefore omitted.

Second In-Process Product

The second in-process product 20 includes the plate-like base member 22, the light-emitting elements 21 placed on or above the base member 22, the protrusion 28 annularly surrounding the light-emitting elements 21, a recess 22a defined by the base member 22 and the protrusion 28, and the first light-transmissive member 23 filled into the recess 22a to cover the light-emitting elements 21. A plurality of light-emitting elements 21 may be provided, and the protrusion 28 may surround the plurality of light-emitting elements 21.

Base Member

At least one light-emitting element 21 is mounted on or above the base member 22, and the base member 22 electrically connects the light-emitting device 200 to an external device. The base member 22 is a plate and includes the wiring 27 on a surface of and/or inside the base member 22. The base member 22 has a substantially square outer shape in a plan view. A material similar to a material used for the base member 2 can be used for the base member 22. Similarly to the base member 2, the base member 22 may include, on its lower surface, a heat dissipation terminal electrically independent of the light-emitting elements 21.

Protruding Part

An insulating material that is less likely to transmit light emitted from the light-emitting elements 21 and extraneous light is preferably used for the protrusion 28. A material with predetermined strength is preferably used for the protrusion 28. Specific examples of such a material include ceramics such as alumina, aluminum nitride, and mullite and resins such as phenolic resins, epoxy resins, silicone resins, polyimide resins, bismaleimide-triazine resins (BT resins), polyphthalamide (PPA), polyamides (PA), and unsaturated polyesters. The height of the protrusion 28 may have any appropriate height. The height of the protrusion 28 is in the range of 0.1 mm to 5 mm, preferably 0.3 mm to 2 mm.

Method of Manufacturing According to Second Embodiment

Subsequently, a method of manufacturing the light-emitting device according to the second embodiment is described referring to FIG. 5 and FIGS. 6A to 6F. The order of some of steps is not limited to the description below but may be changed.

Figure 5:
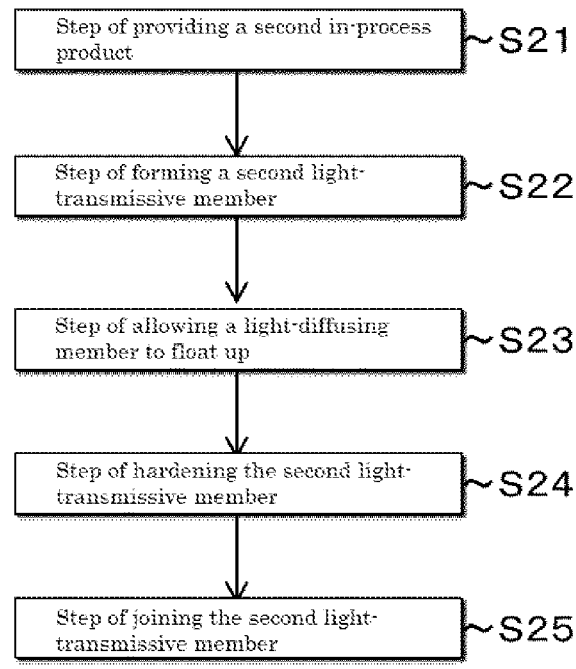
FIG. 5 is a flowchart illustrating a method of manufacturing the light-emitting device according to the second embodiment.

FIG. 5 is a flowchart illustrating the method of manufacturing the light-emitting device according to the second embodiment. The method of manufacturing the light-emitting device according to the second embodiment includes Step S21 of providing a second in-process product, Step S22 of forming a second light-transmissive member, Step S23 of allowing a light-diffusing member to float up, Step S24 of hardening the second light-transmissive member, and Step S25 of joining the second light-transmissive member.

Figure 6A:
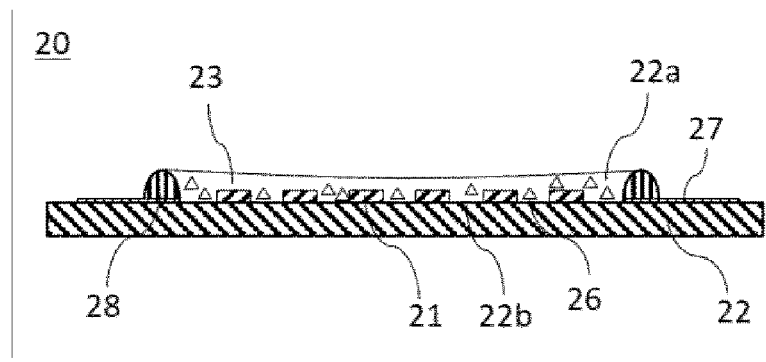
FIG. 6A is a schematic cross-sectional view for illustrating a step of providing a second in-process product in the method of manufacturing the light-emitting device according to the second embodiment.
Figure 6B:
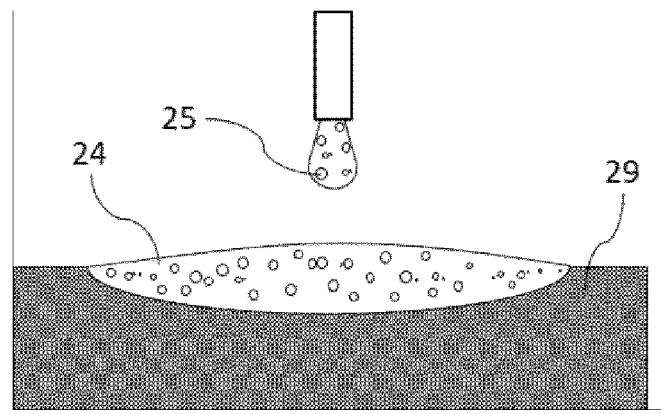
FIG. 6B is a schematic cross-sectional view for illustrating a step of forming a second light-transmissive member in the method of manufacturing the light-emitting device according to the second embodiment.
Figure 6C:
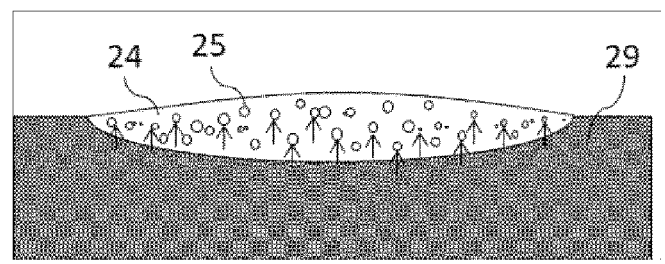
FIG. 6C is a schematic cross-sectional view for illustrating a step of allowing a light-diffusing member to float up in the method of manufacturing the light-emitting device according to the second embodiment.
Figure 6D:
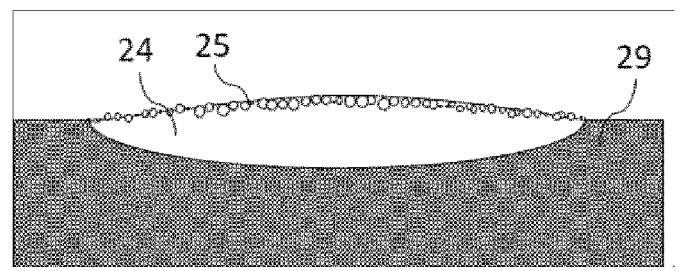
FIG. 6D is a schematic cross-sectional view for illustrating a step of hardening the second light-transmissive member in the method of manufacturing the light-emitting device according to the second embodiment.
Figure 6E:
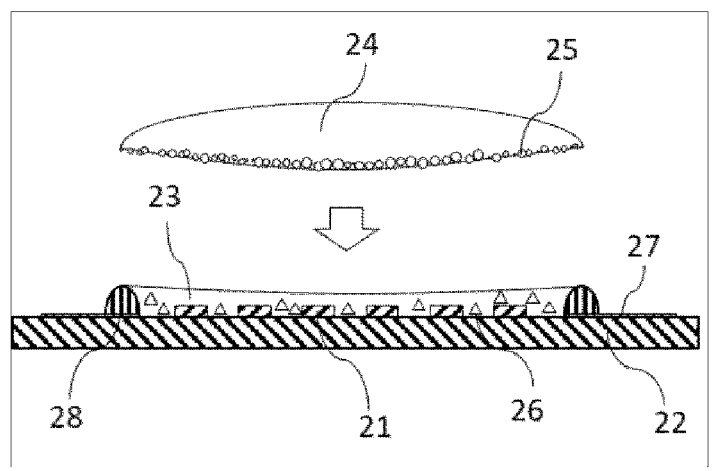
FIG. 6E is a schematic cross-sectional view for illustrating a step of joining the second light-transmissive member in the method of manufacturing the light-emitting device according to the second embodiment.
Figure 6F:
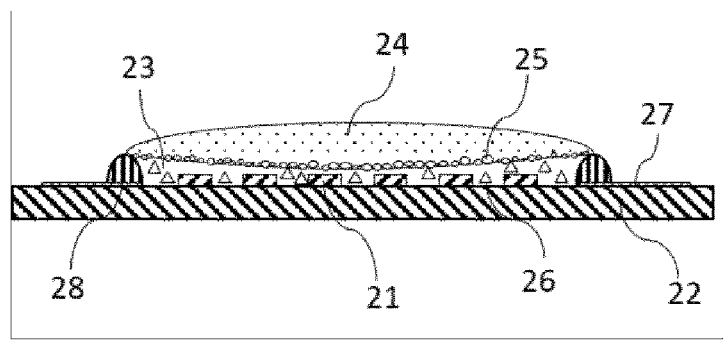
FIG. 6F is a schematic cross-sectional view for illustrating the step of joining the second light-transmissive member in the method of manufacturing the light-emitting device according to the second embodiment.

FIG. 6A is a schematic cross-sectional view for illustrating the step of providing a second in-process product in the method of manufacturing the light-emitting device according to the second embodiment. FIG. 6B is a schematic cross-sectional view for illustrating the step of forming a second light-transmissive member in the method of manufacturing the light-emitting device according to the second embodiment. FIG. 6C is a schematic cross-sectional view for illustrating the step of allowing a light-diffusing member to float up in the method of manufacturing the light-emitting device according to the second embodiment. FIG. 6D is a schematic cross-sectional view for illustrating the step of hardening the second light-transmissive member in the method of manufacturing the light-emitting device according to the second embodiment. FIG. 6E and FIG. 6F are schematic cross-sectional views for illustrating the step of joining the second light-transmissive member in the method of manufacturing the light-emitting device according to the second embodiment.

Providing Second In-Process Product

The second in-process product 20 is provided in which the light-emitting elements 21 are disposed on or above the plate-like base member 22, surrounded by the annular protrusion 28, and covered with the first light-transmissive member 23.

As shown in FIG. 6A, in Step S21 of providing a second in-process product, the second in-process product 20 in which the light-emitting elements 21 are disposed on or above the plate-like base member 22, surrounded by the annular protruding portion 28, and covered with the first light-transmissive member 23 that has been injected into the recess 22a defined by the base member 22 and the protrusion 28 is provided. Hereinafter, a case in which a silicone resin is used for a material of the first light-transmissive member 23 will be illustrated. In Step S21 of providing a second in-process product, the light-emitting elements 21 are electrically connected to the wiring 27 on the base member 22 by wires or bumps. In the first light-transmissive member 23, the phosphor 26 has been added to a silicone resin, and the phosphor 26 is uniformly dispersed in the silicone resin. The silicone resin is dropped into the recess 22a of the base member 22 by, for example, using a potting technique with the use of a dispenser.

Forming Second Light-Transmissive Member

The second light-transmissive member 4 containing at least the light-diffusing member 5 including the hollow particles is provided. Hereinafter, a case in which a silicone resin is used for a material of the second light-transmissive member 24 will be illustrated.

As shown in FIG. 6B, in Step S22 of forming a second light-transmissive member, a silicone resin which will be the second light-transmissive member 24 is injected and filled into a mold 29. In Step S22 of forming a second light-transmissive member, the light-diffusing member 25 has been added to a silicone resin, and the light-diffusing member 25 is uniformly dispersed in the silicone resin. The silicone resin is dropped into the mold 29 by, for example, using a potting technique with the use of a dispenser. Alternatively, the second light-transmissive member 24 may be formed by forming an annular frame on a release film and then injecting and filling the silicone resin into inward of the frame.

As shown in FIG. 6B, in Step S22 of forming a second light-transmissive member, the silicone resin containing the light-diffusing member 25 is filled into the mold 29. Using the light-diffusing member 25 with a predetermined particle size, bulk density, and amount of addition allows the light-diffusing member 25 to float up to the first surface or the vicinity of the first surface of the silicone resin in Step S23, which is the subsequent step, after the light-diffusing member 25 is uniformly dispersed in the silicone resin. The first surface of the second light-transmissive member 24 may be formed into a lenticular shape.

Allowing Light-Diffusing Member to Float Up

The hollow particles are allowed to float up to the first surface of the second light-transmissive member 24, so that the irregularities due to presence of the light-diffusing member 25 are formed on the first surface of the second light-transmissive member 24.

As shown in FIG. 6C, in Step S23 of allowing a light-diffusing member to float up, the light-diffusing member 25 is allowed to float up to the first surface of the silicone resin. In Step S23 of allowing a light-diffusing member to float up, the silicone resin in which the light-diffusing member 25 is uniformly dispersed is left at 40° C. for 12 hours. The light-diffusing member 25 is lighter than the silicone resin, and the adjustment of the particle size and the like has been performed as described above. Therefore, the light-diffusing member 25 gradually floats up within the unhardened silicone resin (see the arrows in FIG. 3C) with time, so that the light-diffusing member 25 floats at the first surface and/or in the vicinity of the first surface of the silicone resin. Irregularities according to the shape of the light-diffusing member 25 are thus formed on the first surface of the silicone resin.

The floating up of the hollow particles may be performed by leaving the second light-transmissive member 24 containing the hollow particles for a predetermined time or by applying vibration such as ultrasonic waves. Applying ultrasonic waves to the second light-transmissive member 24 allows the hollow particles to float up quickly and uniformly; however, the convex shape of the second light-transmissive member 24 may be slightly flattened.

Hardening Second Light-Transmissive Member

The second light-transmissive member 24 is hardened.

As shown in FIG. 6D, in Step S24 of hardening the second light-transmissive member, the silicone resin is hardened. In Step S24 of hardening the second light-transmissive member, the silicone resin is heated at 150° C. for 4 hours. Hardening the silicone resin by heat allows the light-diffusing member 25, which has floated up to the first surface and/or the vicinity of the first surface of the silicone resin, to be fixed at the first surface and/or in the vicinity of the first surface of the silicone resin, so that irregularities are formed on the first surface of the silicone resin. The temperature in the heating is preferably adjusted to a temperature around 150° C. in order to form the irregularities for improving the adhesion to the first light-transmissive member 23 on the first surface of the silicone resin in Step S25, which is the subsequent step.

Joining Second Light-Transmissive Member

The first light-transmissive member 23 and the second light-transmissive member 24 are joined together via the irregularities.

As shown in FIG. 6E and FIG. 6F, in Step S25 of joining the second light-transmissive member, the second light-transmissive member 24 is joined to the first light-transmissive member 23 to cover the first light-transmissive member 23. The irregularities attributable to the light-diffusing member 5 are formed on the joint surface between the first light-transmissive member 23 and the second light-transmissive member 24.

The light-emitting device 200 is manufactured through the above steps. The steps described above have been illustrated referring to one light-emitting device 200, but a plurality of light-emitting devices 200 connected to each other through the base members 22 may be formed at once and then separated to provide individual light-emitting devices 200.

In the method of manufacturing the light-emitting device according to the second embodiment, the particle size, bulk density, amount of addition, and the like are adjusted as appropriate to make the light-diffusing member 25 float up to the vicinity of the bottom surface of the second light-transmissive member 24, so that irregularities due to presence of the light-diffusing member 25 are formed on the bottom surface of the second light-transmissive member 24. Thus, the light-emitting device 200 having a white external appearance viewed from the light-emitting surface can be provided. Further, the light-diffusing member 25 is embedded in the first light-transmissive member 23 or the second light-transmissive member 24, so that a light-emitting device in which the light-diffusing member 25 can be prevented from being damaged by impact or the like can be provided.

Certain examples of the light-emitting device according to the present disclosure will be described below. The light-emitting device according to the present disclosure is not limited to the examples described below.

EXAMPLE 1 AND EXAMPLE 2

Light-emitting devices were produced in accordance with the method of manufacturing the light-emitting device according to the second embodiment.

In the light-emitting device of Example 1, the particle size of the light-diffusing member was 65 μm, the refractive index of the first light-transmissive member was 1.41, and the refractive index of the second light-transmissive member was 1.41. In the light-emitting device of Example 2, the particle size of the light-diffusing member was 65 μm, the refractive index of the first light-transmissive member was 1.55, and the refractive index of the second light-transmissive member was 1.41. In order that the light-emitting devices of Example 1 and Example 2 have the same emission color, a phosphor was further added so that an emission color of 5000 K at chromaticity coordinates (0.328,0.342) was obtained.

Constituent elements of Example 1 and Example 2 are more specifically described below.

Light-Emitting Element

Number of light-emitting elements: 24 light-emitting elements are mounted

Type: configured to emit blue light with a peak emission wavelength of 455 nm

Outer dimensions in a plan view: a square with each side of 0.65 mm (length×width)

Height: 150 μm

Base Member

Material: ceramic

Outer dimensions in a plan view: a square with each side of 15 mm (length×width)

Inside dimensions in a plan view: a square with each side of 12 mm (length×width)

Height: 2.0 mm

Shape: substantially rectangular prism

First Light-Transmissive Member

Material 1: methyl silicone resin (refractive index: 1.41) (product name: OE-6351, manufactured by "Dow Corning Toray Co., Ltd.")

Material 2: phenyl silicone resin (refractive index: 1.55) (product name: OE-6630, manufactured by "Dow Corning Toray Co., Ltd.")

Outer dimensions in a plan view: a circle of 7 mm in diameter

Thickness: 850 μm at the central portion

Hardening condition: at 150° C. for 4 hr.

Second Light-Transmissive Member

Material: methyl silicone resin (product name: OE-6351, manufactured by "Dow Corning Toray Co., Ltd.")

Outer dimensions in a plan view: a circle of 7 mm in diameter

Thickness: 350 μm at the central portion

Hardening condition: at 40° C. for 12 hr.+ at 150° C. for 4 hr.

Light-Diffusing Member

Type: hollow filler

Addition Amount: 10.6 vol % relative to the total volume of the light-transmissive member and the light-diffusing member Shape: sphere Protrusion Material: methyl silicone resin containing a white pigment Outer dimensions in a plan view: a circle of 7 mm in diameter
Thickness: 500 μm
Hardening condition: 150° C.×15 min.

COMPARATIVE EXAMPLE 1

A light-emitting device according to a comparative example was produced for comparison with the light-emitting devices according to the examples.

In the light-emitting device of Comparative Example 1, the particle size of the light-diffusing member was 65 μm, the refractive index of the first light-transmissive member was 1.41, and the second light-transmissive member was not disposed. The light-emitting device of Comparative Example 1 was formed to be same as the light-emitting device of Example 1 except that the second light-transmissive member was not disposed.

Details of constituent elements of Comparative Example 1 are as described above. In Table 1 below, the refractive index of the second light-transmissive member corresponding to Comparative Example 1 is left blank because the light-emitting device of Comparative Example 1 did not include the second light-transmissive member. The particle size of the light-diffusing member and the specific gravity of the light-diffusing member are also left blank because the light-diffusing member was contained in the second light-transmissive member.

The experiments described below were conducted on Example 1, Example 2, and Comparative Example 1.

The object color of the light-emission surface in each of Example 1, Example 2, and Comparative Example 1 were measured using a fast spectrophotometric colorimeter (product name: "CMS-35PS", manufactured by Murakami Color Research Laboratory Co., Ltd.).

Table 1 shows the evaluation results.

Table 1 shows the addition amount of the light-diffusing member (vol %), particle size of the light-diffusing member (μm), specific gravity of the light-diffusing member (g/cm3), refractive index of the first light-transmissive member, refractive index of the second light-transmissive member, object color of the light-emission surface (x,y), and luminous fluxes (%) in each of Example 1, Example 2, and Comparative Example 1.

TABLE 1

| | Addition amount of light-diffusing member (vol %) | Particle size of light-diffusing member (μm) | Specific gravity of light-diffusing member (g/cm$^3$) | Refractive index of first light-transmissive member | Refractive index of second light-transmissive member | Object color (x, y) | Luminous flux (%) |
|---|---|---|---|---|---|---|---|
| Example 1 | 10.6 | 65 | 0.13 | 1.41 | 1.41 | (0.386, 0.447) | 93.2 |
| Example 2 | 10.6 | 65 | 0.13 | 1.41 | 1.55 | (0.391, 0.454) | 94.3 |
| Comparative Example 1 | 0 | | | 1.41 | | (0.430, 0.511) | 100 |

The chromaticity coordinates of the object colors were (0.386,0.447) in Example 1, (0.391,0.454) in Example 2, and (0.430,0.511) in Comparative Example 1. In other words, in Comparative Example 1, the emission color was white, but the object color of the light-emission surface was yellow. This is because the color of the phosphor was seen. On the other hand, in Example 1 and Example 2, both of the emission colors and the object colors were white.

Accordingly, the light-emitting device in which the light-diffusing member is added to the second light-transmissive member and the light-emitting device in which no light-diffusing member is added to the second light-transmissive member have the same emission color while having different colors of the external appearances. In other words, the hollow structure of the light-diffusing member located above the phosphor present at the inner bottom surface of the first light-transmissive member can scatter extraneous light.

In the light-emitting device in which no light-diffusing member was added to the second light-transmissive member, when the light-emitting device was turned on, the difference in brightness between the light-emitting portions, where the light-emitting elements were disposed and the non-light-emitting portions, where no light-emitting element was disposed, was conspicuous. On the other hand, in the light-emitting devices in each of which the light-diffusing member was added to the second light-transmissive member, the difference in brightness between the light-emitting portions and the non-light-emitting portions was not conspicuous due to scattering of light by the light-diffusing member. That is, the layer of the light-diffusing member formed at the bottom surface of the second light-transmissive member reduces unevenness in luminance of the light-emitting device when the light emitting device is turned on.

Certain embodiments of the present invention are described above in detail, but the scope of the present invention is not limited to the description above and should be broadly interpreted on the basis of the claims. The scope of the present invention also includes various modifications of these descriptions.

The light-emitting devices according to the embodiments of the present disclosure can be used for lighting equipment, backlights for liquid-crystal panels, and other apparatuses.

What is claimed is:

1. A light-emitting device, comprising:
    a light-emitting element;
    a first light-transmissive member covering the light-emitting element;
    a second light-transmissive member covering the first light-transmissive member such that an interface exists between the first light-transmissive member and the second light-transmissive member; and
    light-diffusing hollow particles disposed within the second light-transmissive member and adjacent to the interface between an upper surface of the first light-transmissive member and a bottom surface of the second light-transmissive member,
    wherein the second light-transmissive member bottom surface has irregularities due to the presence of the light-diffusing hollow particles.

2. The light-emitting device according to claim 1, wherein, in the irregularities on the bottom surface of the second light-transmissive member, at least a portion of the light-diffusing hollow particles is exposed from the second light-transmissive member and is covered by the first light-transmissive member.

3. The light-emitting device according to claim 1, wherein the first light-transmissive member further comprises a phosphor, and phosphor density at an interface between the light-emitting element and the first light-transmissive member is higher than the phosphor density at the first light-transmissive member bottom surface.

4. The light-emitting device according to claim 1, wherein the light-diffusing hollow particles have a particle size in a range of 20 μm to 70 μm based on median diameter.

5. The light-emitting device according to claim 1, wherein the light-diffusing hollow particles have a bulk density in a range of 0.1 g/cm$^3$ to 0.7 g/cm$^3$ relative to the second light-transmissive member.

6. The light-emitting device according to claim 1, wherein the light-emitting device further comprises a base member having a recess defined by an inner bottom surface and a lateral wall, and the light-emitting element is disposed on or above the inner bottom surface of the recess.

7. The light-emitting device according to claim 1, wherein the light-diffusing hollow particles have a spherical shape.

8. The light-emitting device according to claim 6, wherein the lateral wall comprises an annular protrusion on the inner bottom surface of the base member.

9. The light-emitting device according to claim 1, wherein the light emitting device includes a plurality of the light-emitting elements.

10. The light-emitting device according to claim 1, wherein a base material of the first light-transmissive member comprises a silicone resin.

11. The light-emitting device according to claim 1, wherein a base material of the second light-transmissive member comprises a silicone resin.

12. A method of manufacturing a light-emitting device, the method comprising:
    providing a first intermediate product comprising:
        a base member having a recess,
        a light-emitting element on or above an inner bottom surface of the base member, and
        a first light-transmissive member covering the light-emitting element;
    providing a second light-transmissive member which includes light-diffusing hollow particles;
    allowing the light-diffusing hollow particles to float up to a first surface of the second light-transmissive member to form irregularities due to the presence of the light-diffusing hollow particles, on the first surface of the second light-transmissive member;
    hardening the second light-transmissive member; and
    joining the first light-transmissive member and the second light-transmissive member together via the irregularities such that the light-diffusing hollow particles disposed adjacent to an interface between the first surface of the second light-transmissive member and an upper surface of the first light-transmissive member.

13. A method of manufacturing a light-emitting device, the method comprising:
    providing a second intermediate product comprising:
        a plate-like base member, a light-emitting element on or above the base member,
        an annular protrusion surrounding the light-emitting element, and
        a first light-transmissive member covering the light-emitting element;
    providing a second light-transmissive member which includes light-diffusing hollow particles;
    allowing the light-diffusing hollow particles to float up to a first surface of the second light-transmissive member to form irregularities due to the presence of the light-diffusing hollow particles, on the first surface of the second light-transmissive member;
    hardening the second light-transmissive member; and
    joining the first light-transmissive member and the second light-transmissive member together via the irregularities such that the light-diffusing hollow particles disposed adjacent to an interface between the first surface of the second light-transmissive member and an upper surface of the first light-transmissive member.

14. The light-emitting device according to claim 1, wherein the light-diffusing hollow particles include at least one of hollow silica particles, hollow polymer particles, porous silica particles, and porous polymer particles.

15. The light-emitting device according to claim 1, wherein the light-diffusing hollow particles have a shell thickness in a range of 1 μm to 30 μm.

16. The light-emitting device according to claim 11, wherein the second light-transmissive member has a refractive index of 1.50 to 1.55 and the light-diffusing hollow particles are hollow silica particles having a refractive index of 1.35 to 1.45.

17. The light-emitting device according to claim 1, wherein the light-diffusing hollow particles comprise an amount in a range of 1.56 vol % to 19.3 vol % with respect to the second light-transmissive member.

18. The light-emitting device according to claim 1, wherein irregularities on the bottom surface of the second light-transmissive member have height differences of 2 μm to 5 μm.

19. The light-emitting device according to claim 1, wherein the second light-transmissive member has a lenticular shape.

20. The light-emitting device according to claim 3, wherein the phosphor includes at least one of cerium-activated yttrium-aluminum-garnet (YAG)-based phosphors; cerium-activated lutetium-aluminum-garnet (LAG)-based phosphors; europium- and/or chromium-activated nitrogen-containing calcium aluminosilicate (CaO—$Al_2O_3$—$SiO_2$)-based phosphors; europium-activated silicate (($Sr,Ba)_2SiO_4$)-based phosphors; β-SiAlON phosphors; $CaAlSiN_3$:Eu (CASN)-based phosphors; (Sr,Ca)$AlSiN_3$:Eu (SCASN) phosphors; $K_2SiF_6$:Mn (KSF) phosphors; and sulfide-based phosphors.

* * * * *